(12) United States Patent
Osanai

(10) Patent No.: US 12,145,352 B2
(45) Date of Patent: Nov. 19, 2024

(54) METAL/CERAMIC BONDING SUBSTRATE AND METHOD FOR PRODUCING SAME

(71) Applicant: DOWA METALTECH CO., LTD., Tokyo (JP)

(72) Inventor: Hideyo Osanai, Tokyo (JP)

(73) Assignee: DOWA METALTECH CO, LTD., Tokyo (JP)

( * ) Notice: Subject to any disclaimer, the term of this patent is extended or adjusted under 35 U.S.C. 154(b) by 30 days.

(21) Appl. No.: 17/430,894

(22) PCT Filed: Feb. 10, 2020

(86) PCT No.: PCT/JP2020/005050
§ 371 (c)(1),
(2) Date: Aug. 13, 2021

(87) PCT Pub. No.: WO2020/170877
PCT Pub. Date: Aug. 27, 2020

(65) Prior Publication Data
US 2022/0032580 A1 Feb. 3, 2022

(30) Foreign Application Priority Data
Feb. 22, 2019 (JP) .................. 2019-030743

(51) Int. Cl.
*B22D 19/00* (2006.01)
*B22D 19/02* (2006.01)
(Continued)

(52) U.S. Cl.
CPC .............. *B32B 9/041* (2013.01); *B22D 19/02* (2013.01); *B22D 19/04* (2013.01); *B32B 9/005* (2013.01);
(Continued)

(58) Field of Classification Search
CPC .................. B22D 19/00; B22D 19/04
(Continued)

(56) References Cited

U.S. PATENT DOCUMENTS 4,597,431 A * 7/1986 Hobo et al. ............ B22D 18/04
164/253
5,944,097 A * 8/1999 Gungor et al. ...... H05K 1/0203
428/209

(Continued)

FOREIGN PATENT DOCUMENTS

JP 2001144224 A 5/2001

OTHER PUBLICATIONS

International search report for patent application No. PCT/JP2020/005050 dated May 8, 2020.
(Continued)

*Primary Examiner* — Kevin P Kerns
(74) *Attorney, Agent, or Firm* — Bachman & LaPointe, P.C.

(57) ABSTRACT

A metal/ceramic bonding substrate wherein the bonding strength of an aluminum plate bonded directly to a ceramic substrate is higher than that of conventional metal/ceramic bonding substrates, and a method for producing same, wherein the method includes arranging a ceramic substrate in a mold; putting the mold in a furnace; lowering an oxygen concentration to 25 ppm or less and a dew point to −45° C. or lower in the furnace; injecting a molten metal of aluminum into the mold to contact the surface of the ceramic substrate; and cooling and solidifying the molten metal to form a metal plate for a circuit pattern of aluminum on one side of the ceramic substrate to bond one side of the metal plate for a circuit pattern directly to the ceramic substrate, while forming a metal base plate of aluminum on the other side of the ceramic substrate.

7 Claims, 3 Drawing Sheets

(51) Int. Cl.
| | |
|---|---|
| B22D 19/04 | (2006.01) |
| B32B 9/00 | (2006.01) |
| B32B 9/04 | (2006.01) |
| B32B 15/20 | (2006.01) |
| C04B 37/02 | (2006.01) |
| C04B 41/00 | (2006.01) |
| C04B 41/45 | (2006.01) |
| C04B 41/51 | (2006.01) |
| C04B 41/88 | (2006.01) |
| H01L 23/14 | (2006.01) |
| H05K 3/38 | (2006.01) |

(52) U.S. Cl.
CPC ............ *B32B 15/20* (2013.01); *C04B 37/021* (2013.01); *C04B 37/023* (2013.01); *C04B 41/009* (2013.01); *C04B 41/4523* (2013.01); *C04B 41/5155* (2013.01); *C04B 41/88* (2013.01); *B32B 2250/42* (2013.01); *B32B 2457/08* (2013.01); *C04B 2237/064* (2013.01); *C04B 2237/366* (2013.01); *C04B 2237/402* (2013.01); *C04B 2237/60* (2013.01); *C04B 2237/708* (2013.01); *H01L 23/142* (2013.01); *H05K 3/38* (2013.01); *H05K 2203/128* (2013.01)

(58) Field of Classification Search
USPC .................................................. 164/91, 98
See application file for complete search history.

(56) References Cited

U.S. PATENT DOCUMENTS

| | | | |
|---|---|---|---|
| 5,965,193 A | 10/1999 | Ning et al. | |
| 6,183,875 B1* | 2/2001 | Ning et al. | H05K 3/0061 257/E23.106 |
| 2005/0016707 A1* | 1/2005 | Osanai et al. | B22D 19/00 164/98 |
| 2005/0072547 A1* | 4/2005 | Osanai et al. | H05K 3/101 257/E23.106 |

OTHER PUBLICATIONS

Extended European Search Report dated Dec. 1, 2022 for corresponding EP application No. 20758564.7.

* cited by examiner

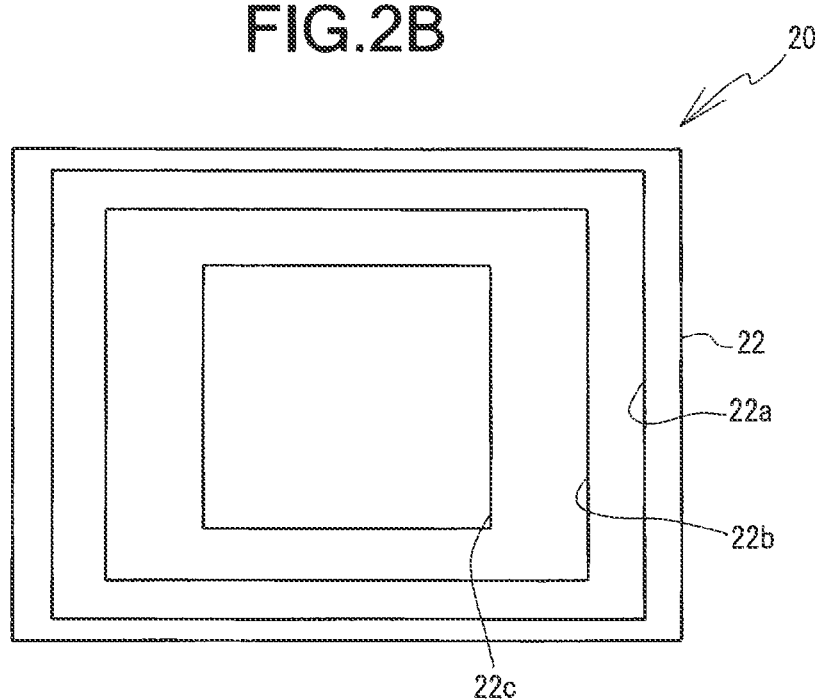

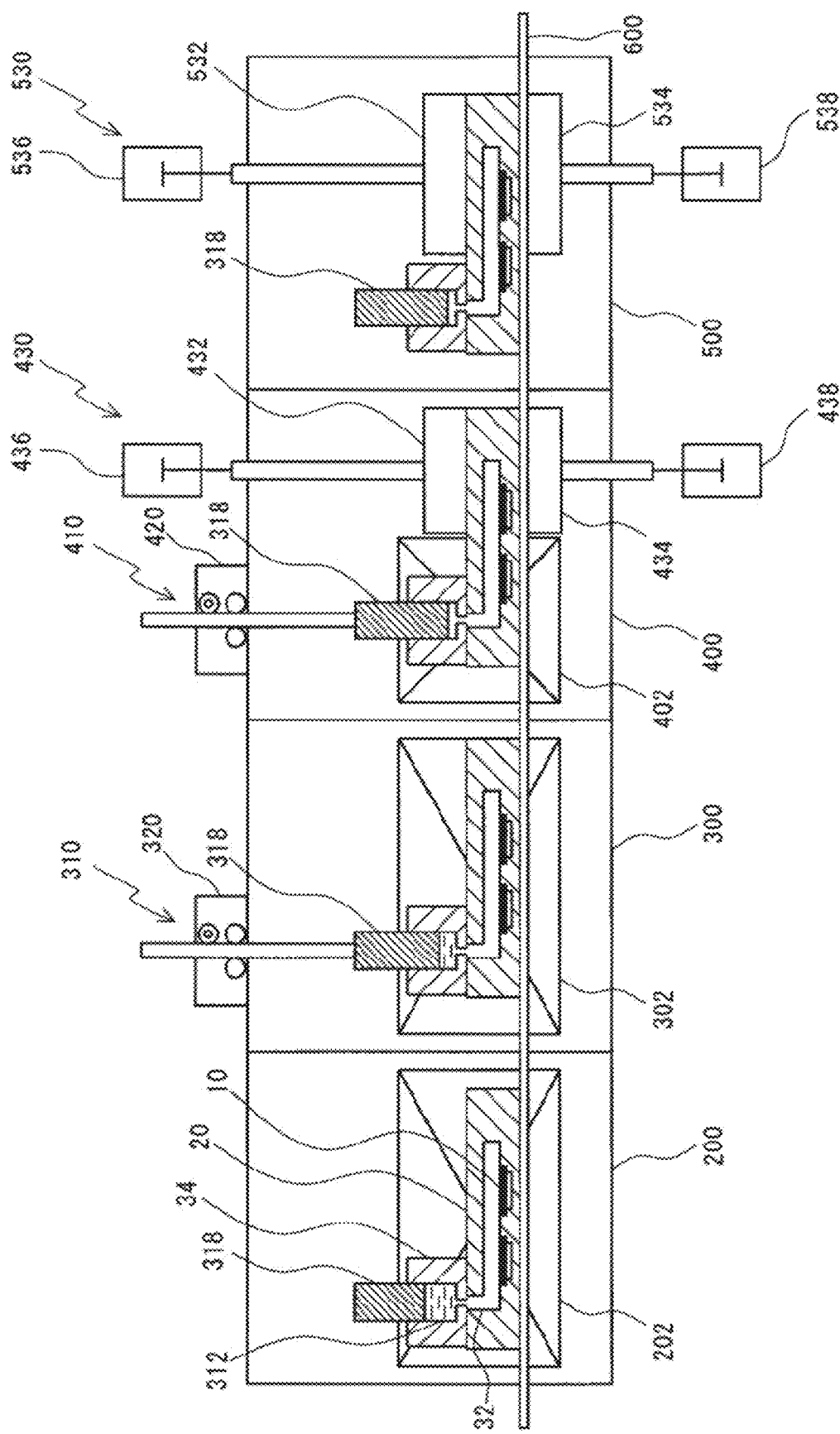

METAL/CERAMIC BONDING SUBSTRATE AND METHOD FOR PRODUCING SAME

TECHNICAL FIELD

The present invention relates generally to a metal/ceramic bonding substrate and a method for producing the same. More specifically, the invention relates to a metal/ceramic bonding substrate wherein an aluminum plate is bonded to a ceramic substrate of aluminum nitride, and a method for producing the same.

BACKGROUND ART

In conventional power modules used for controlling heavy-current for electric vehicles, electric railcars, machine tools and so forth, a metal/ceramic insulating substrate is fixed to one side of a metal base plate by soldering, and semiconductor chips are fixed to the metal/ceramic insulating substrate by soldering. On the other side (back) of the metal base plate, a heat-radiating fin or cooling jacket of a metal is mounted via a thermally conductive grease by means of screws or the like.

Since the soldering of the metal base plate and semiconductor chips to the metal/ceramic insulating substrate is carried out by heating, the metal base plate is easy to warp due to the difference in thermal expansion coefficient between bonded members during soldering. In addition, heat generated from the semiconductor chips passes through the metal/ceramic insulating substrate, solder and metal base plate to be radiated from the heat-radiating fin or cooling jacket to air or cooling water. For that reason, if the metal base plate warps during soldering, when the heat-radiating fin or cooling jacket is mounted on the metal base plate, the clearance therebetween increases, so that the heat radiating properties of the metal base plate are extremely deteriorated. Moreover, since the thermal conductivity of solder itself is low, it is desired that a power module for allowing the flow of heavy-current has higher heat radiating properties.

In order to solve these problems, there is proposed a metal/ceramic bonding substrate wherein an aluminum plate is bonded directly to a ceramic substrate of aluminum nitride or the like without soldering between the metal base plate and the metal/ceramic insulating substrate (see, e.g., Patent Document 1).

PRIOR ART DOCUMENT(S)

Patent Document(s)

Patent Document 1: JP 2001-144224 (Paragraph Numbers 0016-0017)

SUMMARY OF THE INVENTION

Problem to be Solved by the Invention

However, in the metal/ceramic bonding substrate proposed in Patent Document 1, the peel strength between the aluminum plate and the ceramic substrate is about 30 kg/cm. In recent years, there is desired a metal/ceramic bonding substrate having a higher bonding strength.

It is therefore an object of the present invention to eliminate the aforementioned conventional problems and to provide a metal/ceramic bonding substrate wherein the bonding strength of an aluminum plate bonded directly to a ceramic substrate is higher than that of conventional metal/ceramic bonding substrates, and a method for producing the same.

Means for Solving the Problem

In order to accomplish the aforementioned object, the inventors have diligently studied and found that it is possible to produce a metal/ceramic bonding substrate wherein the bonding strength of an aluminum plate bonded directly to a ceramic substrate is higher than that of conventional metal/ceramic bonding substrates, if the metal/ceramic bonding substrate is produced by a method comprising the steps of: arranging a ceramic substrate in a mold; putting the mold in a furnace; lowering an oxygen concentration to 25 ppm or less and a dew point to −45° C. or lower in the furnace; injecting a molten metal of aluminum into the mold so as to allow the molten metal to contact one side of the ceramic substrate; and cooling and solidifying the molten metal in the mold to form an aluminum plate on the one side of the ceramic substrate to bond the aluminum plate directly to the ceramic substrate. Thus, the inventors have made the present invention.

According to the present invention, there is provided a method for producing a metal/ceramic bonding substrate, the method comprising the steps of: arranging a ceramic substrate in a mold; putting the mold in a furnace; lowering an oxygen concentration to 25 ppm or less and a dew point to −45° C. or lower in the furnace; injecting a molten metal of aluminum into the mold so as to allow the molten metal to contact one side of the ceramic substrate; and cooling and solidifying the molten metal in the mold to form an aluminum plate on the one side of the ceramic substrate to bond the aluminum plate directly to the ceramic substrate.

In this method for producing a metal/ceramic bonding substrate, the aluminum plate is preferably an aluminum plate for circuit pattern. When the molten metal of aluminum is injected into the mold so as to contact the one side of the ceramic substrate, the molten metal of aluminum is preferably injected into the mold so as to contact the other side of the ceramic substrate, to form an aluminum base plate on the other side of the ceramic substrate to bond the aluminum base plate directly to the ceramic substrate. The ceramic substrate is preferably a ceramic substrate of aluminum nitride, and the aluminum preferably has a purity of 99.9% by weight or more. The injecting and cooling of the molten metal are preferably carried out while pressurizing the molten metal.

According to the present invention, there is provided a metal/ceramic bonding substrate comprising: a ceramic substrate; and an aluminum plate of aluminum bonded directly to one side of the ceramic substrate, wherein an oxide layer formed in a bonded interface between the aluminum plate and the ceramic substrate has a maximum thickness of 4 nm or less, and wherein a bonding strength between the aluminum plate and the ceramic substrate is 330 N/cm or more.

In this metal/ceramic bonding substrate, the aluminum plate is preferably an aluminum plate for a circuit pattern. The metal/ceramic bonding substrate preferably further comprises an aluminum base plate of aluminum bonded directly to the other side of the ceramic substrate, wherein an oxide layer formed in a bonded interface between the aluminum base plate and the ceramic substrate has a maximum thickness of 4 nm or less, and wherein a bonding strength between the aluminum base plate and the ceramic substrate is 330 N/cm or more. The maximum thickness of the oxide layer is preferably 3 nm or less, and the bonding strength is preferably 350 N/cm or more. The ceramic substrate is preferably a ceramic substrate of aluminum nitride, and the aluminum preferably has a purity of 99.9% by weight or more.

Effects of the Invention

According to the present invention, it is possible to produce a metal/ceramic bonding substrate wherein the bonding strength of an aluminum plate bonded directly to a ceramic substrate is higher than that of conventional metal/ceramic bonding substrates.

BRIEF DESCRIPTION OF THE DRAWINGS

FIG. 2B is a plan view of a lower mold member of the mold of FIG. 2A; and

FIG. 3 is a schematic view of an apparatus used for producing the metal/ceramic bonding substrate of FIG. 1A.

MODE FOR CARRYING OUT THE INVENTION

In the preferred embodiment of a method for producing a metal/ceramic bonding substrate according to the present invention, a ceramic substrate (preferably a ceramic substrate of aluminum nitride, alumina, silicon nitride or the like) is arranged in a mold, and then, the mold is put in in a furnace. The oxygen concentration in the furnace is lowered to 25 ppm or less (preferably 15 ppm or less), and the dew point in the furnace is lowered to −45° C. or lower (preferably −48° C. or lower). Then, a molten metal of aluminum (preferably having a purity of not less than 99.9% by weight, more preferably having a purity of not less than 99.99% by weight) is poured into the mold so as to contact the surface of the ceramic substrate (preferably while being pressurized at a pressure of about 5 to 15 kPa by nitrogen gas or the like while removing oxide films therefrom). Thereafter, while the molten metal in the mold is preferably pressurized at about 5 to 15 kPa by blowing nitrogen gas or the like into the mold, the molten metal is cooled and solidified to form a metal plate for a circuit pattern of aluminum on one side of the ceramic substrate to bond one side of the metal plate for circuit pattern directly to the ceramic substrate while forming a metal base plate of aluminum on the other side of the ceramic substrate to bond the metal base plate directly to the ceramic substrate.

Figure 1A:
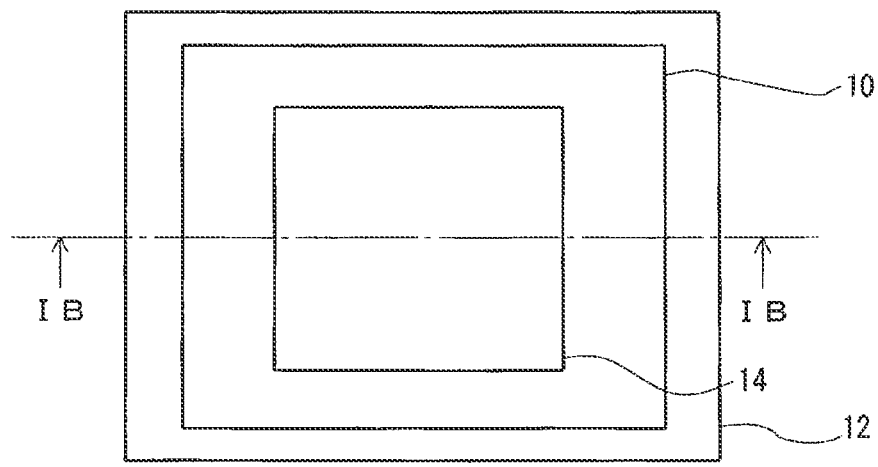
FIG. 1A is a plan view of the preferred embodiment of a metal/ceramic bonding substrate according to the present invention.
Figure 1B:
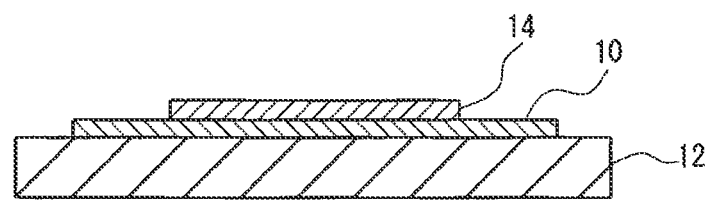
FIG. 1B is a sectional view of the metal/ceramic bonding substrate taken along line IB-IB in FIG. 1A.

As shown in FIGS. 1A and 1B, in the preferred embodiment of a method for producing a metal/ceramic bonding substrate according to the present invention, at least one (one in the shown preferred embodiment) metal plate for a circuit pattern (at least one aluminum plate for circuit pattern) 14 of aluminum (preferably having a purity of not less than 99.9% by weight, more preferably having a purity of not less than 99.99% by weight) having a substantially rectangular planar shape is bonded directly to one side of a ceramic substrate 10 of aluminum nitride having a substantially rectangular planar shape, and a metal base plate (aluminum base plate) 12 of aluminum (preferably having a purity of not less than 99.9% by weight, more preferably having a purity of not less than 99.99% by weight) having a substantially rectangular planar shape is bonded directly to the other side (back) of the ceramic substrate 10. In the bonded interface between the ceramic substrate 10 and the metal plate for circuit pattern 14 and in the bonded interface between the ceramic substrate 10 and the metal base plate 12, there are formed an oxide layer (not shown), respectively. The maximum thickness of the oxide layer is 4 nm or less (preferably 3 nm or less). The bonding strength between the ceramic substrate 10 and the metal plate (for circuit pattern) 14 (or between the ceramic substrate 10 and the metal base plate 12) is not less than 330 N/cm (preferably not less than 350 N/cm).

Figure 2A:
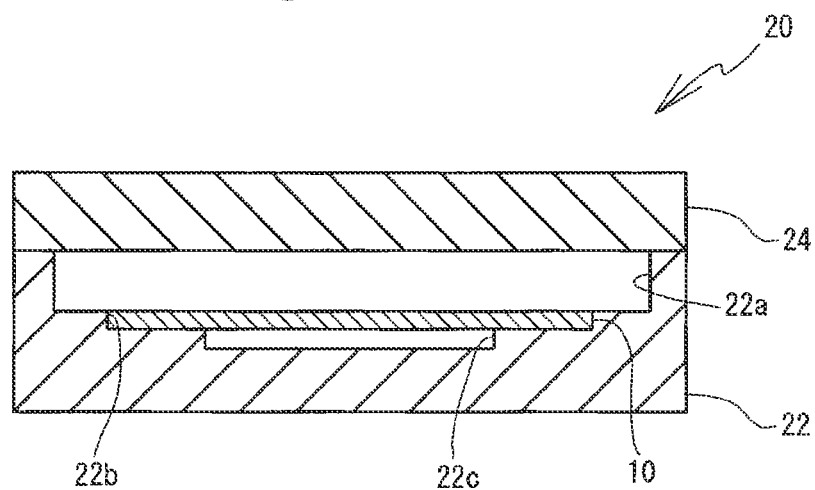
FIG. 2A is a sectional view of a mold used for producing the metal/ceramic bonding substrate of FIG. 1A.

The metal/ceramic bonding substrate in this preferred embodiment can be produced by the above-described preferred embodiment of the method for producing a metal/ceramic bonding substrate according to the present invention, using, e.g., a mold 20 shown in FIGS. 2A and 2B.

As shown in FIG. 2A, the mold 20 is made of an air permeable (molten-metal impermeable) material, such as a (porous) carbon or a porous metal, and comprises a lower mold member 22 and an upper mold member 24, each of which has a substantially rectangular planar shape. As shown in FIGS. 2A and 2B, the top surface of the lower mold member 22 has a recessed portion (for forming a metal base plate) (a metal base plate forming portion) 22a for forming the metal base plate 12. The substantially central portion of the bottom surface of the metal base plate forming portion 22a has at least one (one in the shown preferred embodiment) recessed portion (for housing therein the ceramic substrate 10) (at least one ceramic substrate housing portion) 22b, which substantially has the same shape and size as those of the ceramic substrate 10. The bottom surface of the ceramic substrate housing portion 22b has at least one (one in the shown preferred embodiment) recessed portion (for forming a circuit pattern) (at least one portion for forming a metal plate for a circuit pattern) 22c for forming a metal plate for a circuit pattern. Furthermore, the upper mold member 24 has a sprue (inlet) (not shown) for injecting a molten metal in the metal base plate forming portion 22a of the lower mold member 22 from a molten-metal injecting nozzle (not shown), and the lower mold member 22 has a molten metal passage (not shown) which extends between the metal base plate forming portion 22a and the metal plate (for circuit pattern) forming portion 22c for establishing a communication between the metal base plate forming portion 22a and the metal plate (for circuit pattern) forming portion 22c even if the ceramic substrate 10 is housed in the ceramic substrate housing portion 22b.

Such a mold 20 may be used for producing the metal/ceramic bonding substrate in the preferred embodiment shown in FIGS. 1A and 1B, by a method comprising the steps of: arranging the ceramic substrate 10 in the ceramic substrate housing portion 22b of the lower mold member 22; covering the lower mold member 22 with the upper mold member 24; putting the mold in the furnace; lowering the oxygen concentration to 25 ppm or less (preferably 15 ppm or less, more preferably 10 ppm or less) and the dew point to −45° C. or lower (preferably −48° C. or lower, more preferably −50° C. or lower) in the furnace; pouring the molten metal of aluminum into the mold so as to cause the molten metal to contact the surface of the ceramic substrate; and cooling and solidifying the molten metal of aluminum.

Such a metal/ceramic bonding substrate can be produced by, e.g., a metal/ceramic bonding substrate producing apparatus shown in FIG. 3.

The metal/ceramic bonding substrate producing apparatus shown in FIG. 3 is a furnace for bonding a metal member to a ceramic substrate, and comprises a pre-replacing section (not shown), a preheating section 200, a molten-metal injecting section 300, a pressurizing cooling section 400, a cooling section 500, a post-replacing section (not shown), and a conveyance path 600. Furthermore, this metal/ceramic bonding substrate producing apparatus is desired to produce a metal/ceramic bonding substrate using the mold 20 which has a melting pot 34 surrounding a sprue (inlet for molten metal) 32.

The preheating section 200, the molten-metal injecting section 300, the pressurizing cooling section 400 and the cooling section 500 are treatment sections, which can maintain a different atmosphere from the outside atmosphere, respectively (the preheating section 200, the molten-metal injecting section 300 and the pressurizing cooling section 400 being capable of further maintaining a different temperature from the outside temperature) and which are arranged adjacent to each other in substantially horizontal directions. The inner walls of the preheating section 200, molten-metal injecting section 300, pressurizing cooling section 400 and cooling section 500 are coated with an air permeable heat insulating material (not shown). This heat insulating material may be a fiber-based heat insulating material, a foamed plastic-based heat insulating material or the like. Each of the upper and lower wall portions of the preheating section 200, molten-metal injecting section 300, pressurizing cooling section 400 and cooling section 500 have a gas introducing nozzle (not shown) which extends to the heat insulating material of a corresponding one of the upper and lower inner walls thereof and which is designed to supply a gas (an inert gas, such as nitrogen gas or argon gas, a reducing gas or the like) to the heat insulating materials of the upper and lower wall surfaces from the outside of the upper and lower wall portions, respectively, to introduce the gas, which is supplied to the heat insulating materials, to the interiors of the preheating section 200, molten-metal injecting section 300, pressurizing cooling section 400 and cooling section 500, respectively. By thus coating the inner walls with the heat insulating material and by introducing the gas into the sections via the heat insulating materials of the upper and lower inner walls, it is possible to decrease the dew point to −45° C. or lower (preferably −48° C. or lower).

On the left side of the preheating section 200 arranged on the leftmost side in the drawing, the pre-replacing section (not shown) is arranged adjacent to the preheating section 200 in substantially horizontal directions. The left side wall portion of the pre-replacing section in the drawing has a mold input port (not shown). On the right side of the cooling section 500 arranged on the rightmost side in the drawing, the post-replacing section (not shown) is arranged adjacent to the cooling section 500 in substantially horizontal directions. The right-side wall of the post-replacing section in the drawing has a mold output port (not shown). The interiors of the pre-replacing section and post-replacing section are designed to be repeatedly vacuumed by means of a rotary pump and gas-replaced (purged) from air to an inert gas, such as nitrogen gas or argon gas, or a reducing gas, for decreasing oxygen introduced into the bonding furnace from the outside.

Each of the partition between the pre-replacing section (not shown) and the preheating section 200, the partition between the preheating section 200 and the molten-metal injecting section 300, the partition between the molten-metal injecting section 300 and the pressurizing cooling section 400, the partition between the pressurizing cooling section 400 and the cooling section 500, and the partition between the cooling section 500 and the post-replacing section (not shown) has a connecting hole with shutter (not shown). On the pre-replacing side of the upper wall portion of the preheating section 200 and on the post-replacing side of the upper wall portion of the cooling section 500, an exhaust port (capable of adjusting the aperture thereof) is formed for adjusting the aperture thereof so that the pressure in the preheating section 200 is lower than the pressure in the molten-metal injecting section 300 while the pressure in the cooling section 500 is lower than the pressure in the pressurizing cooling section 400 on the basis of the monitored differential pressure from the external pressure.

The conveyance path 600 passes through the mold input port, the connecting hole and the mold output port to extend in substantially horizontal directions for causing the mold 20 to be sequentially conveyed from the mold input port to the interior of the post-replacing section (not shown) via the pre-replacing section (not shown), the preheating section 200, the molten-metal injecting section 300, the pressurizing cooling section 400 and the cooling section 500 to be taken out from the mold output port.

The preheating section 200 is designed to heat the mold 20 by means of an internally mounted heater 202 to melt solid aluminum in the melting pot 34 to maintain the temperature of the obtained molten metal 312, after air is replaced with an atmosphere of inert gas, such as nitrogen gas or argon gas, or an atmosphere of a reducing gas, therein, the mold 20 being introduced from the outside into the preheating section 200, the mold 20, in which the ceramic substrate 10 is arranged, having the melting pot 34 into which the solid aluminum is introduced and into which a piston 318 is fitted.

The molten-metal injecting section 300 is designed to inject the molten metal of aluminum into the mold 20 introduced from the preheating section 200. The molten-metal injecting section 300 has a heater 302 for maintaining the temperature of the mold 20, and a molten-metal injecting apparatus 310 for injecting the molten metal 312 into the mold 20. The molten-metal injecting apparatus 310 comprises the piston 318 for injecting the molten metal 312 from the melting pot 34 into the mold 20, and a piston driving apparatus 320 for driving the piston 318. When the piston 318 in the melting pot 34 of the conveyed mold 20 reaches directly below the molten-metal injecting apparatus 310, the piston 318 is designed to move downward by means of the piston driving apparatus 320 to inject the molten metal 312 from the melting pot 34 into the mold 20.

The pressurizing cooling section 400 is designed to solidify the molten metal by cooling the mold 20 while pressurizing the molten metal in the mold 20 introduced from the molten-metal injecting section 300. The pressurizing cooling section 400 has a heater 402 for maintaining the temperature near the sprue 32 in the mold 20, a pressurizing apparatus 410 for pressurizing the molten metal 312 in the mold 20 from the sprue 32 of the mold 20, and a cooling apparatus 430 for cooling a portion, which is apart from the sprue 32 of the mold 20, from the top and bottom thereof. The pressurizing apparatus 410 has a piston driving apparatus 420 for moving the piston 318 downward to pressurize the molten metal 312 in the mold 20 when the piston 318 in the melting pot 34 of the conveyed mold 20 reaches directly below the pressurizing apparatus 410. The cooling apparatus 430 comprises an upper cooling block 432 which is arranged on or near the upper portion of a portion apart from the sprue 32 of the mold 20 to cool the upper portion, a lower cooling block 434 which is arranged on or near the lower portion of the portion apart from the sprue 32 of the mold 20 to cool the lower portion, and cooling block driving apparatuses 436 and 438 for moving the upper cooling block 432 and the lower cooling block 434 upward and downward, respectively.

The pressurizing cooling section 400 is designed to solidify the molten metal 312 by cooling the mold 20 while the molten metal 312 injected into the mold 20 is pressurized from a high-temperature side to a low-temperature side, the high-temperature side and the low-temperature side being formed in the mold 20 by cooling a part of the mold 20. If the molten metal 312 is thus pressurized from the high-temperature side to the low-temperature side during cooling, i.e., if the molten metal 312 is pressurized in the opposite direction to the direction of solidification, unsolidified portions of the molten metal on the high-temperature side are smoothly supplied to a portion in which the metal solidified on the low-temperature side is contracted, so that it is possible to finally obtain a metal/ceramic bonding substrate having no shrinkage cavities. If the mold 20 is cooled so that the portion on the side of the sprue 32 in the mold 20 is the high-temperature side while the portion on the opposite side to the sprue 32 is the lower-temperature side than the portion on the side of the sprue 32, it is possible to simplify the structure of the mold 20 and producing apparatus for producing a metal/ceramic bonding substrate.

The cooling section 500 is designed to cool the introduced mold 20, which contains the molten metal 312 solidified in the pressurizing cooling section 400, on the whole. The cooling section 500 has a cooling apparatus 530 for cooling the mold 20 from the top and bottom thereof. The cooling apparatus 530 comprises an upper cooling block 532 which is arranged on or near the upper portion of the mold 20 to cool the upper portion, a lower cooling block 534 which is arranged on or near the lower portion of the mold 20 to cool the lower portion, and cooling block driving apparatuses 536 and 538 for moving the upper cooling block 532 and the lower cooling block 534 upward and downward to cause the blocks 532 and 534 to be arranged on or near the mold 20, respectively.

EXAMPLES

Examples of a metal/ceramic bonding substrate and a method for producing the same according to the present invention will be described below in detail.

Example 1

First, there was prepared a mold of carbon (having the same shape as the mold 20 shown in FIGS. 2A and 2B), wherein the top surface of a lower mold member had a recessed portion (for forming a metal base plate) (a metal base plate forming portion), for forming a metal base plate which had a substantially rectangular planar shape and which had a size of 70 mm×70 mm×5 mm, wherein the substantially central portion of the bottom surface of the base plate forming portion had a recessed portion (a ceramic substrate housing portion) for housing therein a ceramic substrate which had a substantially rectangular planar shape and which had a size of 50 mm×50 mm×0.6 mm, wherein the substantially central portion of the bottom surface of the ceramic substrate housing portion had a recessed portion (for forming a circuit pattern) (a portion for forming a metal plate for circuit pattern) for forming a metal plate for circuit pattern, which had a substantially rectangular planar shape and which had a size of 48 mm×48 mm×0.6 mm, and wherein a molten metal passage was formed so as to extend between the metal base plate forming portion and the portion for forming the metal plate for a circuit pattern.

Then, an aluminum nitride substrate (a polycrystalline aluminum nitride substrate (SHAYPAL SH-30) produced by Tokuyama Corporation), which had a substantially rectangular planar shape and which had a size of 50 mm×50 mm×0.6 mm, was housed in the ceramic substrate housing portion of the lower mold member of the mold. Then, after the lower mold member was covered with an upper mold member, the mold was put in a bonding furnace (shown in FIG. 3). Then, the atmosphere in the furnace was caused to be an atmosphere of nitrogen (by supplying nitrogen gas at a flow rate of 5 L/minute to the heat insulating materials of the upper and lower inner walls of the preheating section 200 and cooling section 500, respectively, while supplying nitrogen gas at a flow rate of 15 L/minute to the heat insulating materials of the upper and lower inner walls of the molten-metal injecting section 300 and pressurizing cooling section 400), to lower the oxygen concentration to 2 ppm and the dew point to −60° C. (in the molten-metal injecting section 300), and the mold was heated to 730° C. by controlling the temperature of a heater. Furthermore, the oxygen concentration and dew point in the bonding furnace were measured by means of a zirconia oxygen concentration meter (LD-300, SA25NW produced by Toray Engineering Co., Ltd.) and a dew point meter (DRYCAP Dew Point Converter DMT152 produced by Vaisala Corporation), respectively. In addition, a previously metered molten metal of aluminum having a purity of 99.9% by weight (3N) was heated to 740° C. This molten metal was poured from the sprue into the mold while removing oxide films via a nozzle having a narrow portion and while applying a pressure of 10 kPa by nitrogen gas. After the molten metal of aluminum was thus poured into the mold, the molten metal of aluminum in the mold was cooled to be solidified while the pressure of 10 kPa was applied to the molten metal by blowing nitrogen gas from the gas pressurizing nozzle into the sprue. Thus, there was obtained a metal/ceramic bonding substrate wherein an aluminum plate for circuit pattern was bonded directly to one side of the aluminum nitride substrate while an aluminum base plate was bonded to the other side thereof. Furthermore, in this example, oxygen introduced into the bonding furnace from the outside was decreased by repeatedly vacuuming by means of a rotary pump and purging with nitrogen gas, in the pre-replacing section and post-replacing section.

The metal/ceramic bonding substrate thus obtained was taken out from the mold. Then, a diamond cutter was used for cutting the metal/ceramic bonding substrate in thickness directions in the central portion in longitudinal directions (or in width directions) thereof. Then, after the cut surface of the metal/ceramic bonding substrate was embedded in a resin so as to be able to observe the bonded interface between the aluminum nitride substrate and the aluminum base plate and the bonded interface between the aluminum nitride substrate and the aluminum plate for circuit pattern, the surface thereof was polished by means of a rotary polishing machine. This cut surface was observed (STEM-EDS analyzed) by means of a scanning transmission electron microscope (STEM) and an energy dispersive X-ray spectroscopy (EDS) analyzer, and the maximum thickness of oxide layers produced in the bonded interfaces was measured on the basis of a bright-field STEM image. As a result, the maximum thickness was 1 nm.

After the metal/ceramic bonding substrate obtained by the same method as that in this embodiment was taken out from the mold, the metal/ceramic bonding substrate was masked so as to allow an aluminum plate for a circuit pattern having a size of 10 mm×48 mm×0.6 mm to remain in the central portion of the aluminum plate for the circuit pattern having the size of 48 mm×48 mm×0.6 mm in longitudinal directions (or width directions), and then, unnecessary portions of the aluminum plate for circuit pattern were etched with a ferric chloride solution. Thereafter, the bonding strength (peel strength) between the aluminum plate for circuit pattern and the aluminum nitride substrate was measured. As a result, the bonding strength was 350 N/cm or more, so that it was sufficiently high.

Example 2

A metal/ceramic bonding substrate was produced by the same method as that in Example 1, except that aluminum having a purity of 99.99% by weight (4N) was substituted for aluminum having the purity of 99.9% by weight (3N). Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 1 nm, and the bonding strength (peel strength) was 350 N/cm or more, so that it was sufficiently high.

Example 3

A metal/ceramic bonding substrate was produced by the same method as that in Example 1, except that the dew point was −50° C. Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 1 nm, and the bonding strength (peel strength) was 350 N/cm or more, so that it was sufficiently high.

Example 4

A metal/ceramic bonding substrate was produced by the same method as that in Example 1, except that the aperture-adjustable exhaust ports of the preheating section 200 and cooling section 500 (shown in FIG. 3) were continuously closed and that the oxygen concentration (in the molten-metal injecting section 300) was 4 ppm. Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 2 nm, and the bonding strength (peel strength) was 350 N/cm, so that it was sufficiently high.

Example 5

A metal/ceramic bonding substrate was produced by the same method as that in Example 1, except that the aperture-adjustable exhaust ports of the preheating section 200 and cooling section 500 (shown in FIG. 3) were continuously closed, that the flow rates of nitrogen gas introduced into the preheating section 200 and cooling section 500 were 10 L/minute and that the oxygen concentration and the dew point (in the molten-metal injecting section 300) were 10 ppm and −50° C., respectively. Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 3 nm, and the bonding strength (peel strength) was 350 N/cm, so that it was sufficiently high.

Comparative Example 1

A metal/ceramic bonding substrate was produced by the same method as that in Example 1, except that the vacuuming and purging with nitrogen gas were not carried out in the pre-replacing section and post-replacing section and that the oxygen concentration and the dew point (in the molten-metal injecting section 300) were 40 ppm and −60° C., respectively. Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 5 nm, and the bonding strength (peel strength) was 300 N/cm, so that it was not sufficient.

Comparative Example 2

A metal/ceramic bonding substrate was produced by the same method as that in Example 1, except that the dew point was −40° C. by introducing gas directly into the preheating section 200, the molten-metal injecting section 300, the pressurizing cooling section 400 and the cooling section 500 by providing gas introducing nozzles passing through the heat insulating materials of the upper and lower inner walls of the preheating section 200, molten-metal injecting section 300, pressurizing cooling section 400 and cooling section 500 in place of the gas introducing nozzles for introducing gas via the heat insulating materials of the upper and lower inner walls of the preheating section 200, molten-metal injecting section 300, pressurizing cooling section 400 and cooling section 500. Then, the STEM-EDS analysis of the metal/ceramic bonding substrate was carried out by the same method as that in Example 1, and the bonding strength (peel strength) thereof was measured by the same method as that in Example 1. As a result, the maximum thickness of oxide layers produced in the bonded interfaces was 10 nm, and the bonding strength (peel strength) was 280 N/cm, so that it was not sufficient.

DESCRIPTION OF REFERENCE NUMBERS

10 Ceramic Substrate
12 Metal Base Plate
14 Metal Plate for Circuit Pattern
20 Mold
22 Lower Mold Member
22a Recessed Portion for forming Metal Base Plate (Metal Base Plate Forming Portion)
22b Ceramic Substrate Housing Portion
22c Recessed Portion for forming Circuit Pattern (Metal Plate (for Circuit Pattern) Forming Portion)
24 Upper Mold Member
32 Sprue
34 Melting Pot
200 Preheating Section
202, 302, 402 Heater
300 Molten-Metal Injecting Section 310 Molten-Metal Injecting Apparatus
312 Molten Metal
318 Piston
320 Piston Driving Apparatus
400 Pressurizing Cooling Section
432 Upper Cooling Block
434 Lower Cooling Block
436, 438 Cooling Block Driving Apparatus
500 Cooling Section
530 Cooling Apparatus
532 Upper Cooling Block
534 Lower Cooling Block
536, 538 Cooling Block Driving Apparatus
600 Conveyance Path

The invention claimed is:

1. A method for producing a metal/ceramic bonding substrate, the method comprising the steps of:
   arranging a ceramic substrate in a mold;
   putting the mold in a furnace, inner walls of which are coated with an air permeable heat insulating material;
   supplying an inert gas or a reducing gas to the heat insulating material of upper and lower inner walls of the furnace to introduce the gas via the heat insulating material of the upper and lower inner walls to lower an oxygen concentration to 25 ppm or less and a dew point to −45° C. or lower in the furnace;
   injecting a molten metal of aluminum into the mold so as to allow the molten metal to contact one side of the ceramic substrate; and
   cooling and solidifying the molten metal in the mold to form an aluminum plate on the one side of the ceramic substrate to bond the aluminum plate directly to the ceramic substrate.

2. A method for producing a metal/ceramic bonding substrate as set forth in claim 1, wherein the aluminum plate is an aluminum plate for a circuit pattern.

3. A method for producing a metal/ceramic bonding substrate as set forth in claim 1, wherein when the molten metal of aluminum is injected into the mold so as to contact the one side of the ceramic substrate, the molten metal of aluminum is injected into the mold so as to contact the other side of the ceramic substrate, to form an aluminum base plate on the other side of the ceramic substrate to bond the aluminum base plate directly to the ceramic substrate.

4. A method for producing a metal/ceramic bonding substrate as set forth in claim 1, wherein the ceramic substrate is a ceramic substrate of aluminum nitride, and the aluminum has a purity of 99.9% by weight or more.

5. A method for producing a metal/ceramic bonding substrate as set forth in claim 1, wherein the injecting and cooling of the molten metal are carried out while pressurizing the molten metal.

6. A method for producing a metal/ceramic bonding substrate as set forth in claim 1, wherein said inert gas is nitrogen gas or argon gas.

7. A method for producing a metal/ceramic bonding substrate as set forth in claim 1, wherein the metal/ceramic bonding substrate has an oxide layer which is formed in a bonded interface between the aluminum plate and the ceramic substrate and which has a maximum thickness of 4 nm or less, the metal/ceramic bonding substrate having a bonding strength of 330 N/cm or more between the aluminum plate and the ceramic substrate.

* * * * *